United States Patent [19]

Moon et al.

[11] Patent Number: 5,741,613
[45] Date of Patent: Apr. 21, 1998

[54] METHODS OF FORMING HALF-TONE PHASE-SHIFT MASKS WITH REDUCED SUSCEPTIBLITY TO PARASITIC SPUTTERING

[75] Inventors: Seong-yong Moon, Kyungki-do; Jong-wook Kye; Sung-gi Kim, both of Seoul; Sung-chul Lim, Kyungki-do; In-kyun Shin, Seoul, all of Rep. of Korea

[73] Assignee: Samsung Electronics Co., Ltd., Suwon, Rep. of Korea

[21] Appl. No.: 713,953

[22] Filed: Sep. 13, 1996

[30] Foreign Application Priority Data

Sep. 13, 1995 [KR] Rep. of Korea ............... 95-29842

[51] Int. Cl.$^6$ ........................................ G03F 9/00
[52] U.S. Cl. ............................................... 430/5
[58] Field of Search ............................... 430/5, 322, 323, 430/324

[56] References Cited

U.S. PATENT DOCUMENTS

| | | | |
|---|---|---|---|
| 5,478,679 | 12/1995 | Loong et al. | 430/5 |
| 5,514,500 | 5/1996 | Ham | 430/5 |
| 5,536,604 | 7/1996 | Ito | 430/5 |
| 5,543,255 | 8/1996 | Ham | 430/5 |
| 5,547,787 | 8/1996 | Ito et al. | 430/5 |
| 5,549,994 | 8/1996 | Watanabe et al. | 430/5 |
| 5,605,776 | 2/1997 | Isao et al. | 430/5 |
| 5,629,114 | 5/1997 | Isao et al. | 430/5 |

OTHER PUBLICATIONS

Shelden et al., *Actual Use Of Phase Shift Mask*, 15th Annual Symposium on Photomask Technology and Management, 20–22 Sep. 1995, Santa Clara, California, Proceedings, SPIE vol. 2621, pp. 266–272.

Y.C. Pati et al., *Phase–Shifting Masks For Microlithography: Automated Design And Mask Requirements*, J. Opt. Soc. Am. A, vol. 11, No. 9, Sep. 1994, pp. 2438–2452.

James Potzick, *Improving Photomask Linewidth Measurement Accuracy Via Emulated Stepper Aerial Image Measurement*, SPIE vol. 2322, Photomask Technology and Management, Mar. 1994, pp. 353–359.

S. Turner et al., *Optimization Of Aerial Image Quality*, J. Vac. Sci. Technol. B, vol. 11, No. 6, Nov./Dec. 1993, pp. 2446–2451.

*Primary Examiner*—S. Rosasco
*Attorney, Agent, or Firm*—Myers, Bigel, Sibley & Sajovec, P.A.

[57] ABSTRACT

Methods of forming half-tone phase-shift masks include the steps of forming a series of layers on a face of a transparent substrate such as quartz. These layers include a phase-shift layer of MoSiON, a layer of opaque material (e.g., chrome) for blocking light on the phase-shift layer and a photoresist layer on the layer of opaque material. The photoresist layer is then patterned to define a mask having openings therein which expose the layer of opaque material. The layer of opaque material is then patterned using a wet etchant, to expose portions of the phase-shift layer. The patterned photoresist layer is then stripped and a cleaning step is then performed to remove residual defects and marks from the patterned layer of opaque material. The patterned layer of opaque material is then used as a mask during the step of anisotropically dry etching the phase-shift layer using a gas containing $CF_4$ and $O_2$, but not $CHF_3$. The use of a gas containing $CF_4$ and $O_2$ inhibits parasitic sputtering of chrome from the patterned layer of opaque material onto the exposed portions of the face of the transparent substrate, during the dry etching step. In contrast, the use of a gas containing $CHF_3$ and $O_2$ during dry etching of the phase-shift layer may cause the formation of parasitic defects containing chrome on the face of the transparent substrate. These parasitic defects typically cause a reduction in yield when the phase-shift mask is used in the formation of integrated circuits.

14 Claims, 4 Drawing Sheets

METHODS OF FORMING HALF-TONE PHASE-SHIFT MASKS WITH REDUCED SUSCEPTIBLITY TO PARASITIC SPUTTERING

Field of the Invention

The present invention relates to integrated circuits and methods of fabricating integrated circuits, and more particularly to methods of forming masks for photolithographic processing of integrated circuits.

BACKGROUND OF THE INVENTION

Lithography in integrated circuit manufacturing is the collection of processes that transfer two-dimensional patterns to corresponding three-dimensional material structures. In optical lithography, the process by which such a transfer is effected involves the selective exposure of a photosensitive (resist) material by means of optical imaging of the pattern. In particular, typical photolithographic processes for fabricating large scale integrated circuits utilize transparent binary masks comprising quartz with two-dimensional light screen patterns thereon for defining features to be formed on an integrated circuit substrate. However, it is often difficult if not impossible to define features having widths less than about 0.5 µm using conventional photosensitive materials (photoresists) and photolithographic equipment. Accordingly, conventional photolithographic masks may not be suitable for processing highly integrated circuits such as 64M DRAM memory circuits which require linewidths of about 0.4 µm or less.

To address these limitations of conventional masks, phase-shift masks were developed to improve resolution and depth-of-focus (DOF) capability during photolithographic processing. An example of an initial attempt to develop phase-shift masks for improving resolution in photolithography is described in an article by M. D. Levenson, et al. entitled "*Improving Resolution in Photolithography with a Phase-shifting Mask,*" IEEE Trans. Elec. Dev., ED-29, pp. 1828–1836 (1982). The use of phase-shifting masks is motivated by the fact that appropriate modulation of both the phase and intensity of incident light may be simultaneously used to compensate for some of the resolution-limiting effects of optical diffraction. Attempts have also been made to improve the degree of resolution achievable with phase-shift masks, by developing half-tone phase-shift masks. Examples of such attempts are described in U.S. Pat. Nos. 5,514,500 and 5,543,255 to Ham and in U.S. Pat. No. 5,478,679 to Loong et al.

In addition, a conventional method of forming a half-tone mask is illustrated by FIGS. 1–5 and described in articles by Y. Yamada, et al. entitled "*Quality Control of Embedded Type PSM,*" Photomask Journal, Vol. PD-5, (2512–35), pp. 102–103; and Y. Yamada, et al. entitled "*Actual Use of a Phase Shift Mask,*" Proc. 15th Symposium on Photomask Tech. and Mgmt., SPIE Vol. 2621, pp. 266–272, September (1995). This conventional method begins with a series of steps of forming a layer 3 of MoSiON on a face of a quartz substrate 1; forming a layer 5 of chrome on the layer 3 of MoSiON; and forming a layer 7 of photoresist on the layer 5 of chrome, as illustrated by FIG. 1. As illustrated by FIG. 2, the photoresist layer 7 is then patterned using conventional techniques to define a mask 7a having openings therein which expose the chrome layer 5. Referring now to FIGS. 3–4, the chrome layer 5 is then patterned using a wet etchant to expose portions of the MoSiON layer 3. The patterned photoresist layer 7a and patterned chrome layer 5a are then used as a mask during the step of anisotropically dry etching the MoSiON layer 3 using a gas containing $CHF_3$ and $O_2$. The patterned photoresist layer 7a and patterned chrome layer 5a are then removed to expose a patterned half-tone phase-shift mask comprising a patterned layer of MoSiON 3a and quartz substrate 1, as illustrated by FIG. 5. Unfortunately, this resulting phase-shift mask typically contains parasitic defects which reduce the yield of integrated circuits formed therefrom.

Thus, notwithstanding the above described method of forming half-tone phase-shift masks, there continues to be a need for improved methods for forming half-tone phase-shift masks which are free frome parasitic defects.

SUMMARY OF THE INVENTION

It is therefore an object of the present invention to provide improved methods of forming half-tone phase-shift masks.

It is another object of the present invention to provide methods of forming half-tone phase-shift masks which are free from parasitic defects.

It is a further object of the present invention to provide methods of forming half-tone phase-shift masks which can be used to fabricate integrated circuits having linewidths of less than about 0.5 µm.

These and other objects, features and advantages of the present invention are provided by improved methods of forming half-tone phase-shift masks (PSM) which include the initial steps of forming a series of layers on a face of a transparent substrate such as quartz. These layers include a phase-shift layer, a layer of opaque material for blocking light on the phase-shift layer and a layer of photoresist on the layer of opaque material. The phase-shift layer is preferably formed by depositing a blanket layer of MoSiON on the substrate using conventional sputtering techniques. A layer of chrome may then be sputter deposited onto the blanket layer of MoSiON to form the layer of opaque material. The deposited photoresist layer is then patterned using conventional techniques to define a mask having openings therein which expose the layer of opaque material. The layer of opaque material (e.g., chrome) is then patterned using a wet etchant, to expose portions of the phase-shift layer. The patterned photoresist layer is then stripped using conventional techniques. A cleaning step is then performed to remove residual defects and marks from the patterned layer of opaque material and the exposed portions of the phase-shift layer.

The patterned layer of opaque material is then used as a mask during the step of anisotropically dry etching the phase-shift layer using a gas containing $CF_4$ and $O_2$, but not $CHF_3$. As determined by the inventors herein, the use of a gas containing $CF_4$ and $O_2$, but not conventionally used $CHF_3$, inhibits parasitic sputtering of chrome from the patterned layer of opaque material onto the exposed portions of the face of the transparent substrate during the dry etching step. In contrast, the use of a gas containing $CHF_3$ and $O_2$ during dry etching of the phase-shift layer may cause the formation of parasitic defects containing chrome, on the face of the transparent substrate. These parasitic defects typically cause a reduction in yield when the phase-shift mask is used in the formation of integrated circuits. If necessary, the patterned layer of opaque material may then be partially or completely stripped using conventional techniques to form a half-tone phase shift-mask (PSM) containing a patterned phase-shift layer thereon.

DESCRIPTION OF PREFERRED EMBODIMENTS

Figure 1:
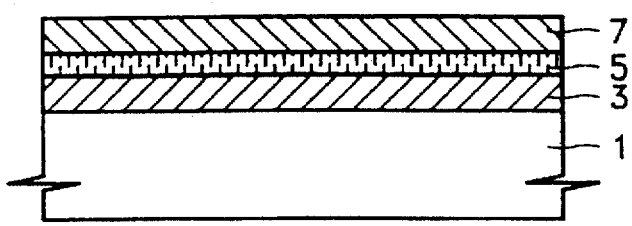
FIGS. 1–5 illustrate schematic cross-sectional views of intermediate structures illustrating a method of forming a half-tone phase-shift mask according to the prior art.
Figure 2:
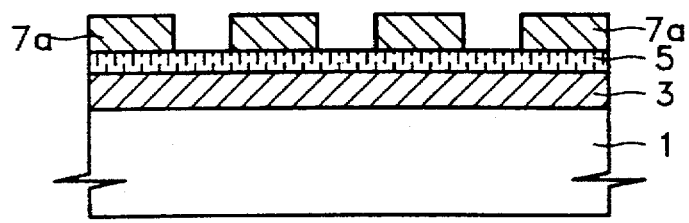
Figure 3:
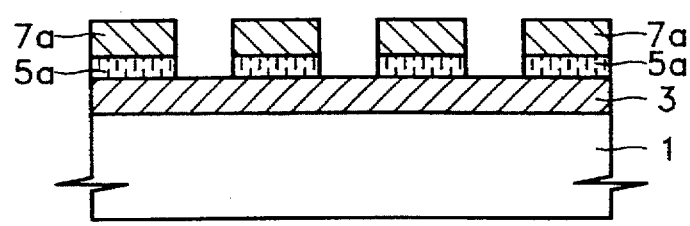
Figure 4:
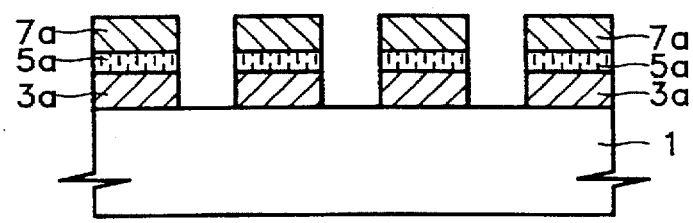
Figure 5:
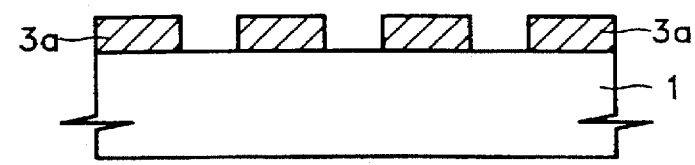

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 6:
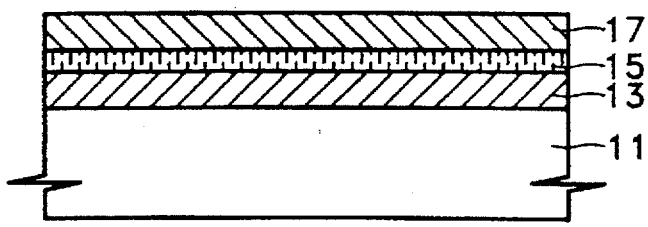
FIGS. 6–11 illustrate schematic cross-sectional views of intermediate structures illustrating a method of forming a half-tone phase-shift mask according to a first embodiment of the present invention.

Referring now to FIGS. 6–11, one embodiment of a preferred method of forming a half-tone phase-shift mask (PSM) will now be described. In particular, FIG. 6 illustrates the steps of forming a series of layers on a face of a transparent substrate 11 which may comprise quartz. These layers include a phase-shift layer 13, a layer 15 of opaque material for blocking light and a deposited photoresist layer 17. The phase-shift layer 13 is preferably formed by depositing a blanket layer of MoSiON on the substrate 11, using conventional sputtering techniques, for example. A layer of chrome may then be sputter deposited onto the blanket layer of MoSiON to form the layer 15 of opaque material.

Figure 7:
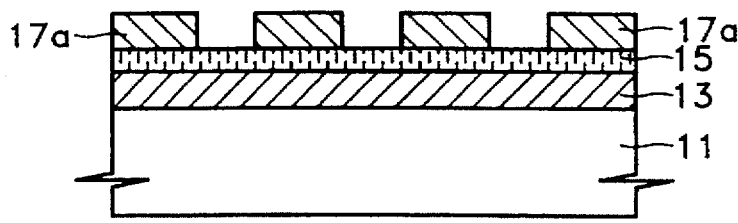
Figure 8:
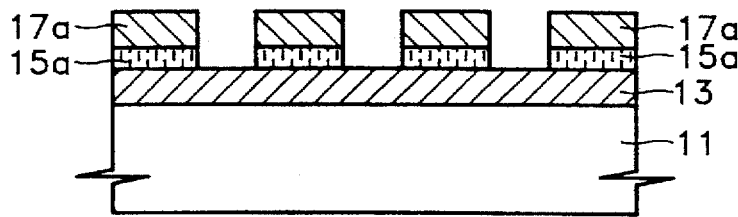
Figure 9:
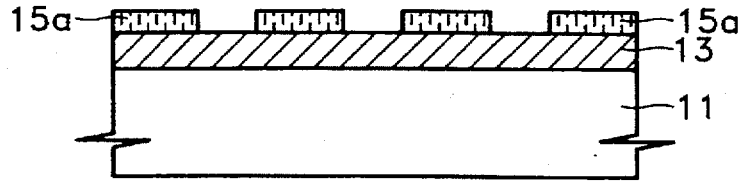

Referring now to FIGS. 7–8, the deposited photoresist layer 17 is then patterned using conventional techniques to define a mask 17a having openings therein which expose the layer 15 of opaque material. The layer 15 of opaque material (e.g., chrome) is then patterned using a wet etchant, to expose portions of the phase-shift layer 13. The patterned photoresist layer (i.e., mask 17a) is then stripped using conventional techniques, as illustrated by FIG. 9. A cleaning step is then performed to remove residual defects and marks from the patterned layer 15a of opaque material and the exposed portions of the phase-shift layer 13.

Figure 10:
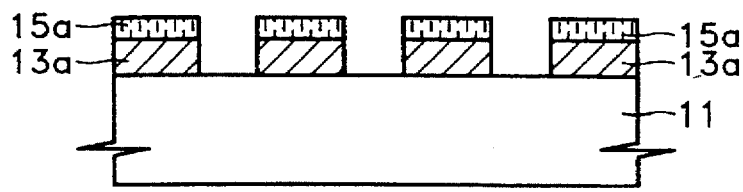
Figure 11:
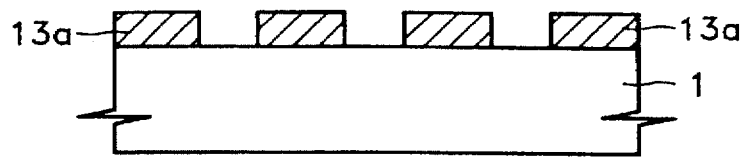

Referring now to FIG. 10, the patterned layer 15a of opaque material is then used as a mask during the step of anisotropically dry etching the phase-shift layer 13 using a gas containing $CF_4$ and $O_2$, but not $CHF_3$. As determined by the inventors herein, the use of a gas containing $CF_4$ and $O_2$, but not conventionally used $CHF_3$, inhibits parasitic sputtering of chrome from the patterned layer 15a of opaque material onto the exposed portions of the face of the transparent substrate 11, during the dry etching step. In contrast, the use of a gas containing $CHF_3$ and $O_2$ during dry etching of the phase-shift layer 13 may cause the formation of parasitic defects containing chrome on the face of the transparent substrate 11. These parasitic defects typically cause a reduction in yield when the phase-shift mask is used in the formation of integrated circuits. If necessary, the patterned layer 15a of opaque material may then be partially or completely stripped using conventional techniques to form a half-tone phase shift-mask (PSM) containing a patterned phase-shift layer 13a thereon, as illustrated best by FIG. 11. However, as will be understood by those skilled in the art, some applications of the phase-shift mask may require the presence of the patterned layer 15a of opaque material.

Figure 12:
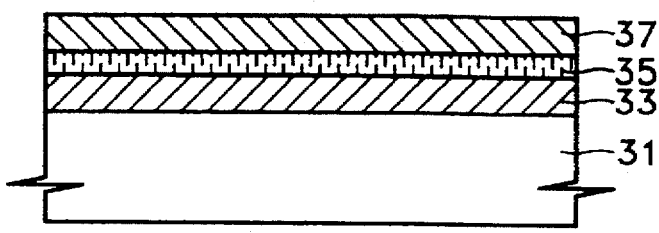
FIGS. 12–20 illustrate schematic cross-sectional views of intermediate structures illustrating a method of forming a half-tone phase-shift mask according to a second embodiment of the present invention.

Referring now to FIGS. 12–20, another embodiment of a preferred method of forming a half-tone phase-shift mask (PSM) will now be described. In particular, FIG. 12 illustrates the steps of forming a series of layers on a face of a transparent substrate 31 which may comprise quartz. These layers include a phase-shift layer 33, a layer 35 of opaque material for blocking light and a first photoresist layer 37. The phase-shift layer 33 is preferably formed by depositing a blanket layer of MoSiON on the substrate 31, using conventional sputtering techniques, for example. A layer of chrome may then be sputter deposited onto the blanket layer of MoSiON to form the layer 35 of opaque material.

Figure 13:
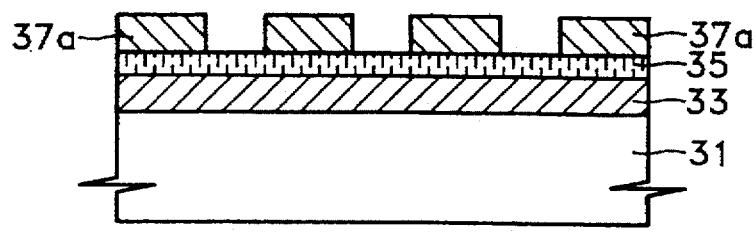
Figure 14:
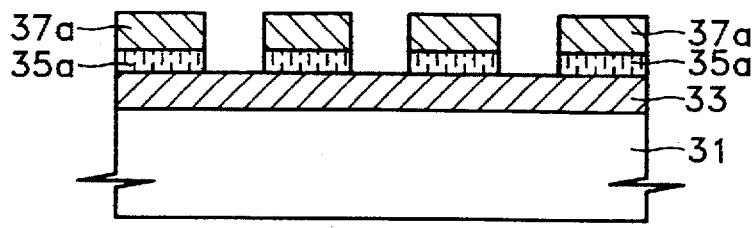
Figure 15:
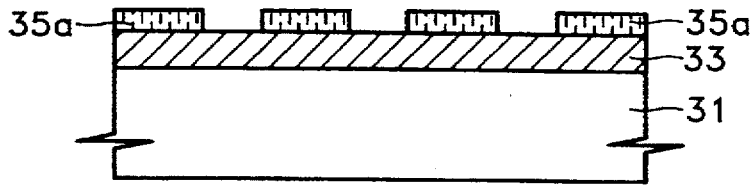

Referring now to FIGS. 13–14, the first photoresist layer 37 is then patterned using conventional techniques to define a first mask 37a having openings therein which expose the layer 35 of opaque material. The layer 35 of opaque material (e.g., chrome) is then patterned using a wet etchant, to expose portions of the phase-shift layer 33. The patterned first photoresist layer (i.e., first mask 37a) is then stripped using conventional techniques, as illustrated by FIG. 15. A cleaning step is then performed to remove residual defects and marks from the patterned layer 35a of opaque material and the exposed portions of the phase-shift layer 33.

Figure 16:
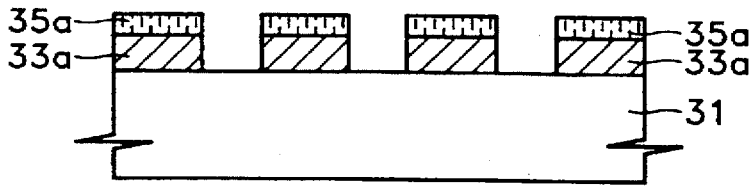

Referring now to FIG. 16, the patterned layer 35a of opaque material is then used as a mask during the step of anisotropically dry etching the phase-shift layer 33 using a gas containing $CF_4$ and $O_2$, but not $CHF_3$, to form a patterned phase-shift layer 33a. As described above with respect to the first embodiment of the present invention illustrated by FIGS. 6–11, the use of a gas containing $CF_4$ and $O_2$, instead of the conventionally used combination of $CHF_3$ and $O_2$, inhibits parasitic sputtering of chrome onto the exposed portions of the face of the transparent substrate 31, during the dry etching step. However, the use of a gas containing $CHF_3$ and $O_2$ during dry etching of the phase-shift layer 33 may result in the formation of parasitic defects containing chrome on the face of the transparent substrate 31.

Figure 17:
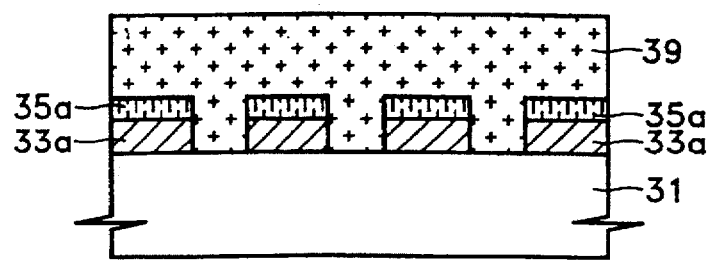
Figure 18:
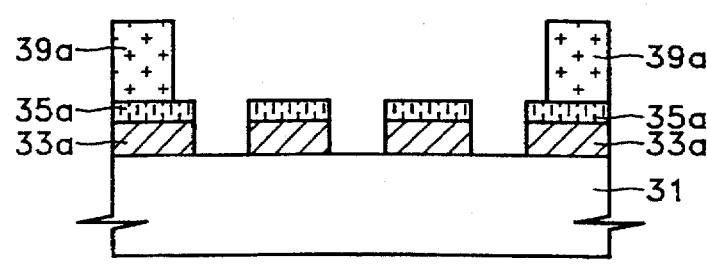
Figure 19:
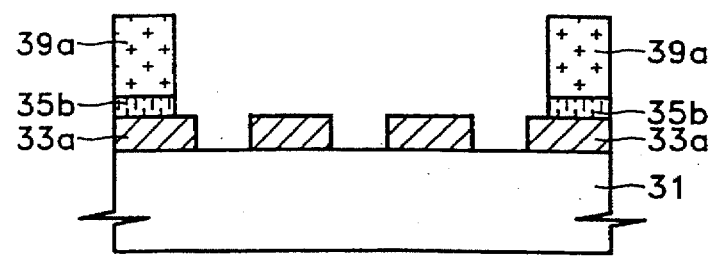
Figure 20:
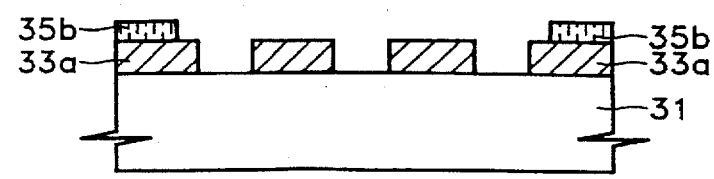

Referring now to FIGS. 17–18, a second layer 39 of photoresist is then deposited on the patterned layer 35a of opaque material and on the exposed portions of the face of the transparent substrate 31. The second layer 39 of photoresist is then patterned to form a second mask 39a. Referring now to FIGS. 19–20, a wet etching step is then performed to remove exposed portions of the patterned layer 35a of opaque material and define an opaque border 35b. The second mask 39a is then stripped using conventional techniques to define another half-tone phase shift mask (PSM) containing a patterned phase-shift layer 33a with an opaque border 35b.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a half-tone phase-shift mask, comprising the steps of:

forming a phase-shift layer on a face of a transparent substrate;

forming a layer of opaque material on the phase-shift layer, opposite the face of the transparent substrate;

forming a mask having openings therein on the layer of opaque material, opposite the phase-shift layer;

patterning the layer of opaque material to expose portions of the phase-shift layer defined by the openings in the mask; then removing the mask from the patterned layer of opaque material; and then forming a patterned phase-shift layer having openings therein which expose the face of the transparent substrate, by removing the exposed portions of the phase-shift layer using the patterned layer of opaque material as an etchant mask.

2. The method of claim 1, wherein said step of patterning the phase-shift layer comprises comprises removing the exposed portions of the phase-shift layer using a dry etchant.

3. The method of claim 1, wherein said step of patterning the layer of opaque material comprises patterning the layer of opaque material using a wet etchant.

4. The method of claim 1, wherein said step of forming a patterned phase-shift layer is preceded by the step of cleaning the exposed portions of the phase-shift layer and the patterned layer of opaque material.

5. The method of claim 4, wherein said step of forming a patterned phase-shift layer is followed by the step of removing the patterned layer of opaque material to thereby expose the patterned phase-shift layer on the face of the transparent substrate.

6. The method of claim 5, wherein said mask forming step comprises the steps of depositing a layer of photoresist on the layer of opaque material; and patterning the deposited layer of photoresist.

7. The method of claim 6, wherein said phase-shift layer forming step comprises forming a layer of MoSiON on the face of the transparent substrate.

8. The method of claim 7, wherein said step of forming a layer of opaque material comprises sputter depositing chrome on the phase-shift layer.

9. The method of claim 1, wherein said phase-shift layer forming step comprises forming a layer of MoSiON on the face of the transparent substrate; and wherein said step of forming a patterned phase-shift layer comprises dry etching the layer of MoSiON using a gas containing $CF_4$ and $O_2$.

10. The method of claim 9, wherein said step of forming a layer of opaque material comprises sputter depositing chrome on the phase-shift layer; and wherein said step of forming a patterned phase-shift layer comprises dry etching the layer of MoSiON using a gas which does not contain $CHF_3$.

11. A method of forming a half-tone phase-shift mask, comprising the steps of:

forming a phase-shift layer containing MoSiON on a face of a transparent substrate;

forming a layer of chrome on the phase-shift layer, opposite the face of the transparent substrate;

patterning a layer of photoresist on the layer of chrome;

patterning the layer of chrome to expose portions of the phase-shift layer by etching the layer of chrome using the patterned layer of photoresist as an etching mask;

removing the patterned layer of photoresist; and then patterning the phase-shift layer to expose portions of the face of the transparent substrate, by selectively dry etching the MoSiON therein using a gas containing $CF_4$ and $O_2$, but not $CHF_3$, and the patterned layer of chrome as a dry etchant mask.

12. The method of claim 11, further comprising the steps of:

depositing a layer of photoresist on the patterned layer of chrome and the exposed portions of the face of the transparent substrate;

patterning the layer of photoresist on the patterned layer of chrome to define a chrome border;

removing chrome from the phase-shift layer using a wet etchant and the patterned layer of photoresist as a etchant mask; and removing the patterned layer of photoresist to expose the chrome border on the patterned phase-shift layer.

13. The method of claim 11, wherein said step of patterning the phase-shift layer is preceded by the step of cleaning the patterned layer of chrome and the exposed portions of the phase-shift layer.

14. The method of claim 13, wherein said cleaning step follows said step of removing the patterned layer of photoresist.

* * * * *